(12) United States Patent
Phoa et al.

(10) Patent No.: US 11,830,818 B2
(45) Date of Patent: Nov. 28, 2023

(54) SEMICONDUCTOR DEVICE HAVING METAL INTERCONNECTS WITH DIFFERENT THICKNESSES

(71) Applicant: Intel Corporation, Santa Clara, CA (US)

(72) Inventors: Kinyip Phoa, Beaverton, OR (US); Jui-Yen Lin, Hillsboro, OR (US); Nidhi Nidhi, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/649,637

(22) Filed: Feb. 1, 2022

(65) Prior Publication Data

US 2022/0157729 A1    May 19, 2022

Related U.S. Application Data

(62) Division of application No. 16/074,142, filed as application No. PCT/US2016/025460 on Apr. 1, 2016, now Pat. No. 11,264,329.

(51) Int. Cl.
*H01L 23/538* (2006.01)
*H01L 21/768* (2006.01)

(52) U.S. Cl.
CPC .... *H01L 23/5384* (2013.01); *H01L 21/76816* (2013.01); *H01L 21/76877* (2013.01); *H01L 21/76897* (2013.01); *H01L 23/5386* (2013.01)

(58) Field of Classification Search
None
See application file for complete search history.

(56) References Cited

U.S. PATENT DOCUMENTS

| | | | |
|---|---|---|---|
| 6,043,164 A | 3/2000 | Nguyen et al. | |
| 6,531,779 B1 | 3/2003 | Oda | |
| 2002/0048944 A1 | 4/2002 | Tang et al. | |
| 2003/0085468 A1 | 5/2003 | Oda | |
| 2003/0207523 A1 | 11/2003 | Liu et al. | |
| 2012/0187566 A1 | 7/2012 | Horak et al. | |
| 2015/0069629 A1 | 3/2015 | Kong et al. | |
| 2015/0115404 A1* | 4/2015 | Hsueh | H01L 28/60 438/3 |

(Continued)

OTHER PUBLICATIONS

International Search Report dated Dec. 26, 2016 issued in corresponding International Application No. PCT/US2016/025460 [12 pages].

(Continued)

*Primary Examiner* — Long Pham
(74) *Attorney, Agent, or Firm* — TROP, PRUNER & HU, P.C.

(57) ABSTRACT

An apparatus includes a first metal layer, a second metal layer and a dielectric material. The first metal layer has a first thickness and a second thickness less than the first thickness, and the first metal layer comprises a first interconnect having a first thickness. The dielectric material extends between the first and second metal layers and directly contacts the first and second metal layers. The dielectric material includes a via that extends through the dielectric material. A metal material of the via directly contacts the first interconnect and the second metal layer.

6 Claims, 6 Drawing Sheets

(56) References Cited

U.S. PATENT DOCUMENTS

| | | |
|---|---|---|
| 2015/0311113 A1 | 10/2015 | Zhang et al. |
| 2018/0025970 A1 | 1/2018 | Kao et al. |
| 2019/0341342 A1 | 11/2019 | Raorane et al. |
| 2020/0205279 A1 | 6/2020 | Ecton |

OTHER PUBLICATIONS

1st Office Action for Taiwan Patent App. No. 106106232, "Semiconductor Device Having Metal Interconnects with Different Thicknesses"; dated Mar. 20, 2020; 4 pages.

IPO Search Report for Taiwan Patent App. No. 106106232; dated Mar. 23, 2020; 1 page.

* cited by examiner

US 11,830,818 B2

SEMICONDUCTOR DEVICE HAVING METAL INTERCONNECTS WITH DIFFERENT THICKNESSES

BACKGROUND

A typical integrated circuit includes electrically conductive traces called "interconnects" for purposes of electrically connecting components of the integrated circuit together, as well as connecting these elements to circuitry external to the integrated circuit. The interconnect cross-sectional area, the spacing between interconnects of adjacent metal layers and the spacing between adjacent interconnects of the same metal layer may be factors contributing to an associated resistance-capacitance (RC) product for the interconnect.

DETAILED DESCRIPTION

Figure 1:
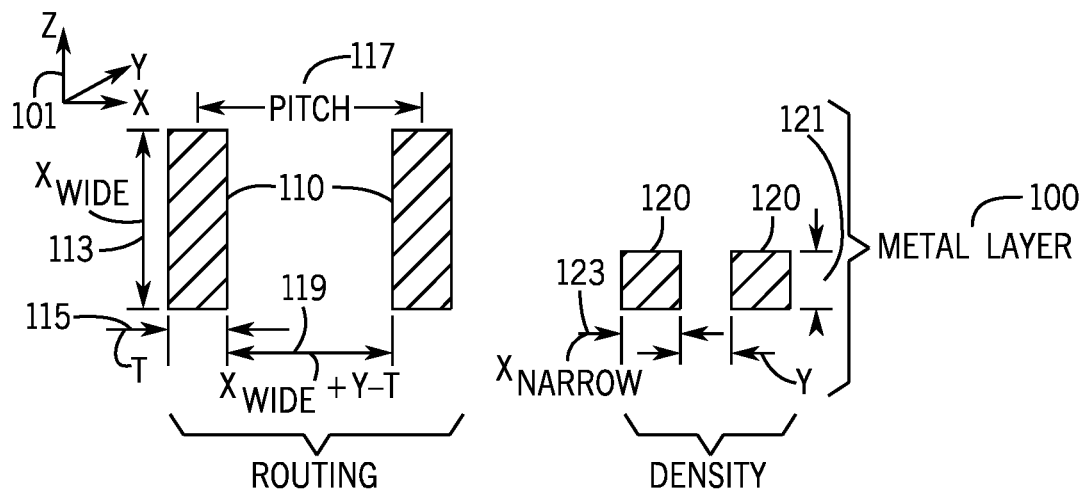
FIGS. 1, 2 and 3 are illustrations of dual thickness metal layers and interconnects that are formed therein according to example implementations.

Reference will now be made to the drawings wherein like structures may be provided with like suffix reference designations. In order to show the structures of various implementations more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated implementations. Moreover, the drawings may only show the structures useful to understand the illustrated implementations. Additional structures known in the art may not have been included to maintain the clarity of the drawings. For example, not every layer of a semiconductor device is necessarily shown. "An implementation", "various implementations" and the like indicate implementation(s) so described may include particular features, structures, or characteristics, but not every implementation necessarily includes the particular features, structures, or characteristics. Some implementations may have some, all, or none of the features described for other implementations. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

In general, the lower the resistance-capacitance (RC) product for a metal interconnect, the faster that a signal may propagate over the interconnect. One way to achieve a lower RC product for a metal interconnect is increase the interconnect's cross-sectional area, thereby decreasing the interconnect's resistance. For a fabrication process in which a metal interconnect is formed in a layer that has a single thickness (herein called a "single thickness metal layer"), the cross-sectional area of the metal interconnect may be increased by increasing the cross-sectional width of the interconnect.

Another way to achieve a lower RC product for a metal interconnect in a single thickness metal layer fabrication process is to increase the effective thickness of the interconnect by forming the interconnect from two metal layers and connecting these layers using vias.

The RC product may not be the only consideration when laying out the interconnects of an integrated circuit. For example, a given set of metal interconnects may not be used for high speed signal routing, and the density of these metal interconnects may be more important than their associated RC products. To achieve a higher density for the metal interconnects, a relatively narrow interconnect width may be used.

In accordance with example implementations that are described herein, an integrated circuit has a metal layer, which has multiple thicknesses. In example implementations that are described herein, the metal layer has two thicknesses (hence, herein called a "dual thickness metal layer"), and metal interconnects are fabricated from these two thicknesses (i.e., the interconnect either has a "single" thickness or a "double" thickness) to impart different associated RC products and interconnect densities. More specifically, in accordance with example implementations, the integrated circuit has metal interconnects for signal routing, which have double thicknesses to impact lower associated RC products, and the integrated circuit has metal interconnects, which have single thicknesses and are used to achieve a relatively higher associated interconnect density.

For a given metal interconnect, the RC product of the interconnect is a function of the R resistance of the interconnect, which is determined by the interconnect's cross-sectional area and several factors that affect the C capacitance: the surface areas between adjacent interconnects (of the same metal layer or adjacent metal layers), the intralayer interconnect spacing and the interlayer interconnect spacing. In general, the smaller the spacing between adjacent metal interconnects of the same metal layer, the larger the C capacitance, and vice versa.

FIG. 1 depicts an example dual thickness metal layer 100, in accordance with an example implementation. More specifically, for this example, FIG. 1 depicts a pair of metal interconnects 110 that are used for signal routing (where the associated RC products are more important) and a pair of metal interconnects 120 used for higher density applications (where associated RC products are less important than an intralayer distance Y between adjacent interconnects 120). As shown in FIG. 1, the metal interconnect 110 has a thickness 113 that is twice the thickness 121 of the metal interconnect 120.

In the notation that is used in FIG. 1, the thickness 113 refers to the dimension of the metal interconnect 110 along a depth dimension z (see axes 101) of the integrated circuit. In this context, the depth dimension z extends through the layers of the integrated circuit; and axes x and y that are orthogonal to the z axis laterally extend along a given layer. The metal interconnect 110, 120 longitudinally extends along the y axis for this example, and the cross-sectional area of the interconnect 110, 120 has the thickness 113 dimension along the z axis and a width 115 dimension along the x axis.

In the notation used in FIG. 1 and subsequent figures, the "$X_{WIDE}$" label is used to denote the equivalent width of a hypothetical metal interconnect that has the same resistance and is formed in a single thickness metal layer, and the "T" label is used to denote the equivalent thickness of this hypothetical interconnect. Thus, in FIG. 1, the metal interconnect 110 of the dual thickness metal layer 100 has a thickness 113 and a width 115, which corresponds to a width and a thickness, respectively, of a metal interconnect fabricated from a single thickness metal layer and having the same resistance (i.e., the interconnect 110 shown in FIG. 1 is rotated 90° from a corresponding interconnect formed from a single thickness metal layer, for example).

As also depicted in FIG. 1, the metal interconnects 120 are spaced apart by the Y distance. Moreover, for this example, the interconnects 110 are spaced apart according to a pitch 117 (i.e., the center-to-center distance between adjacent interconnects 110), which defines the footprint for the interconnect 110. The metal interconnects are separated by a distance $X_{WIDE}+Y-T$.

As compared to conventional interconnects that are formed in a single thickness metal layer, the metal interconnects 110 have a reduced C capacitance for the same resistance. In this manner, as noted above, such a metal interconnect may have a thickness T and a width $X_{WIDE}$. As depicted in FIG. 1, however, due to dual metal thicknesses of the metal layer 100, the interconnect 110 is rotated ninety degrees (as compared to the conventional metal interconnect) so that the separation 119 of the interconnects 110 (i.e., $X_{WIDE}+Y-T$) is increased; and as such, the interconnects 110 are spaced apart farther than the Y spacing of the interconnects 120. Thus, in summary, the interconnects 110 may have the same footprint as conventional interconnects having the same cross-sectional area, but the interconnect 110 has a lower C capacitance (and thus a lower associated RC product) due to the increased intralayer interconnect spacing that is available due to the dual thickness metal layer 100.

As a more specific example, the T width may be 50 nanometers (nm), the $X_{WIDE}$ thickness may be 100 nm, and the Y spacing may be 20 nm. With the conventional interconnect, the left/right capacitance (i.e., capacitances between adjacent metal interconnects), is proportional to T/Y=C*2.5. With the dual thickness metal layer 100 of FIG. 1, however, the left/right capacitance is proportional to $X_{WIDE}/(X_{WIDE}+Y-T)=C*1.4$. Therefore, this a 44% reduction in capacitance, only considering the left/right capacitance.

Figure 2:
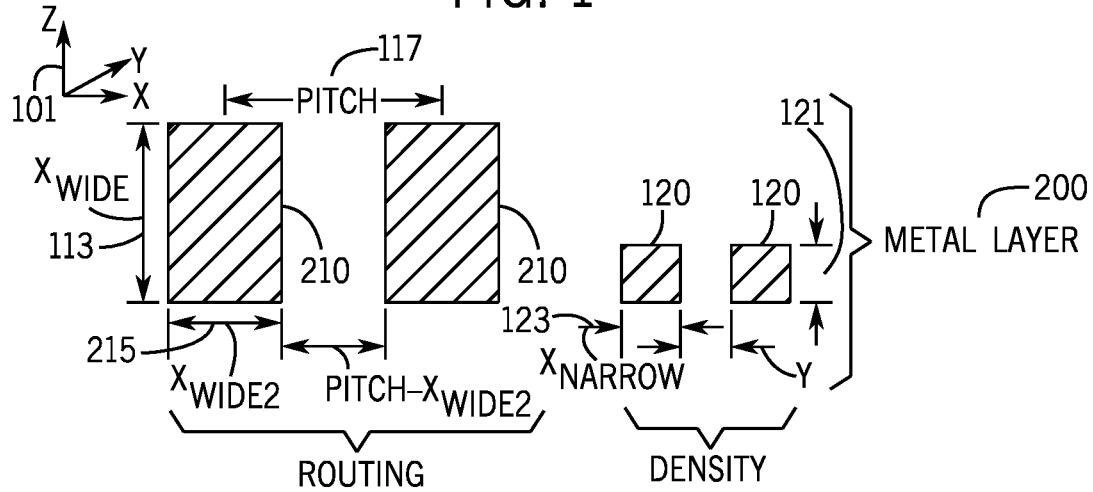

Referring to FIG. 2, as another variation, a dual thickness metal layer 200 may be used to fabricate metal interconnects 210 for signal routing and interconnects 120 for higher density interconnect applications. For this example implementation, the metal interconnects 210 have the same footprint (i.e., the same pitch 117) as the metal interconnects 110 (FIG. 1), but the metal interconnects 210 have lower R resistances. More specifically, as depicted in FIG. 2, as compared to the interconnect 110, a width 215 (also called "$X_{WIDE2}$" herein) is increased, thereby increasing the cross-sectional area of the interconnect 210 to lower its R resistance. Therefore, the RC product associated with the metal interconnect 210 is decreased, while maintaining the same footprint.

Considering the example parameters that are set forth above, the left/right capacitance is kept unchanged at $C_1*2.5$ with a spacing of $Y_2=40$ nm. This allows the metal line width $X_{WIDE2}$ to be 80 nm. As a result, the metal cross-sectional area is increased from $T*X_{WIDE}$ to $X_{WIDE}*X_{WIDE2}$. The R resistance is lowered by 37.5% for this example implementation.

Figure 3:
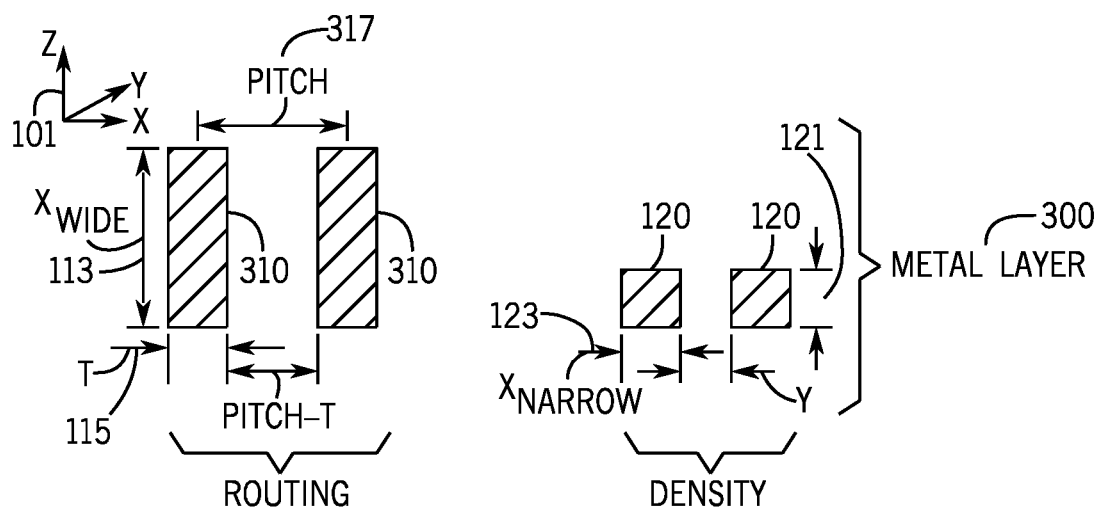

Referring to FIG. 3, in accordance with another example implementation, a dual thickness metal layer 300 may include interconnects 310 that have the same associated RC products as interconnects formed from a single thickness metal layer, but the interconnects 310 have a relatively smaller footprint, i.e., the interconnects 310 have an associated pitch 317 that is decreased. In this manner, the metal interconnect 310 has the same cross-sectional dimensions as the metal interconnect 110 of FIG. 1, with the associated pitch 317 being less than the pitch 117 (FIG. 1).

Thus, the capacitance benefit may be forfeited in exchange of area, in accordance with example implementations, to achieve $C_1*2.5$, $X_{WIDE}/(Pitch-T)=2.5$. For a new pitch 311 of 90 nm, compared to $X_{WIDE}+Y=120$ nm, this is a 0.75X area scaling.

Particular advantages of the metal interconnects that are described herein are that costs may be reduced and fabrication time may be reduced for fabricating high density and signal routing metal interconnects, as mask costs and processing complexity are reduced. Other advantages are contemplated, in accordance with further example implementations.

Figure 4:
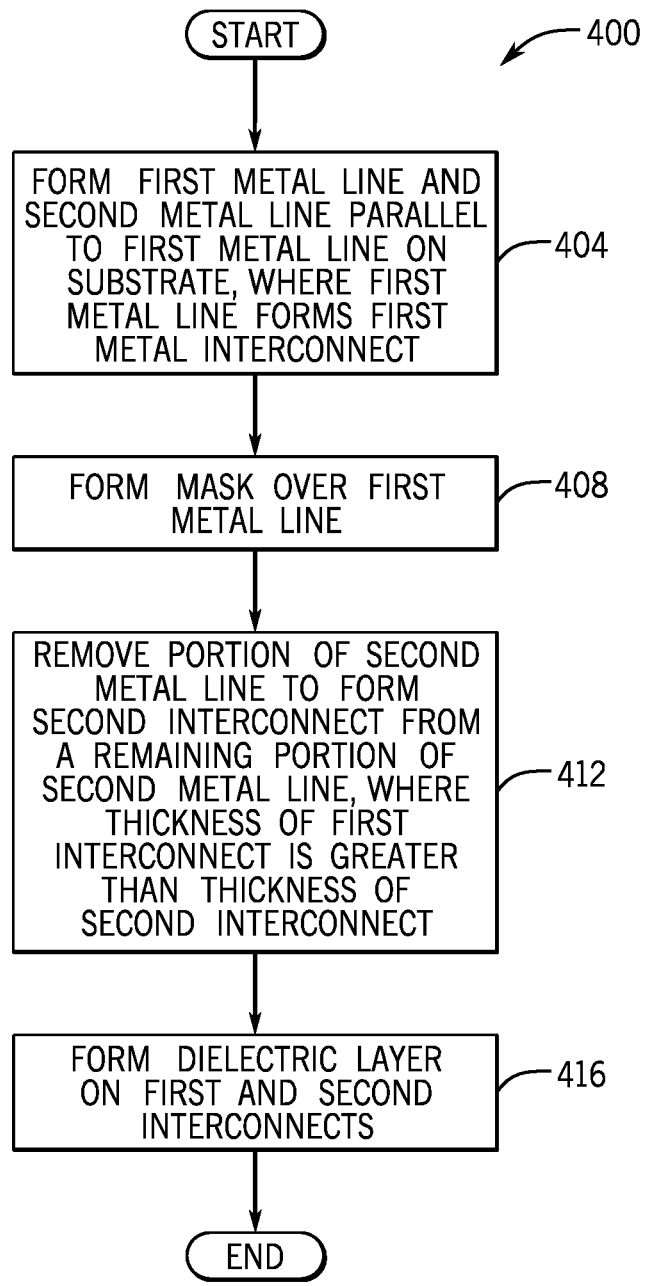
FIGS. 4 and 6 depict semiconductor fabrication processes according to example implementations.
Figure 5A:
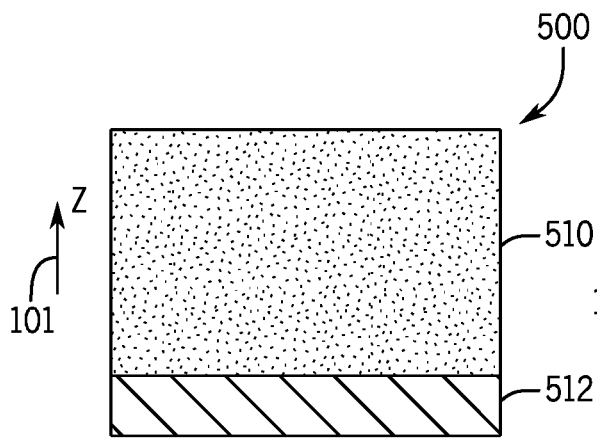
FIGS. 5A, 5B, 5C, 5D, 5E and 5F depict stages of a process to fabricate metal interconnects according to an example implementation.

Referring to FIG. 4, in accordance with example implementations, a technique 400 may be used for purposes of forming interconnects on a substrate 500, which contains a dielectric layer 510 that overlays a metal layer 512, as illustrated in FIG. 5A. As examples, the substrate 500 may be silicon, germanium, gallium arsenide, gallium nitride, or any semiconductor. As examples, the metal layer 512 may be copper, aluminum, tungsten, nickel, platinum, gold, silver or palladium. As examples, the dielectric layer 510 may be silicon oxide, silicon nitride, silicon oxynitride, fluorine doped silicon dioxide, carbon doped silicon dioxide or an organic polymer.

Pursuant to block 404 of the technique 400, a first metal line 526 (see FIG. 5C) and a second metal line 524 (FIG. 5C) that is parallel to the first metal line 526 are formed on the substrate 500. As examples, the first metal line 526 and the second metal line 524 may be formed from one of the metals that are mentioned above for the metal layer 512. The first metal line 526 has a double thickness and forms a first metal interconnect 527 (see FIG. 5F). Pursuant to block 408 of the technique 400, a mask (a photoresist mask 530 of FIG. 5D, for example) is formed over the first metal line 526. Pursuant to block 412 of a technique 400, a portion 540 (see FIG. 5E) of the second metal line 524 is removed from the second metal line 524 to form a second metal interconnect 550 (see FIG. 5F). As depicted in FIG. 5F, a thickness of the first metal interconnect 527 is greater than a thickness of the second metal interconnect 550. Pursuant to block 416 of the technique 400, a dielectric layer is formed on the first 527 and second 550 metal interconnects, as illustrated in FIG. 5F. The dielectric layer may be any of the materials mentioned above for the dielectric layer 510.

Figure 5B:
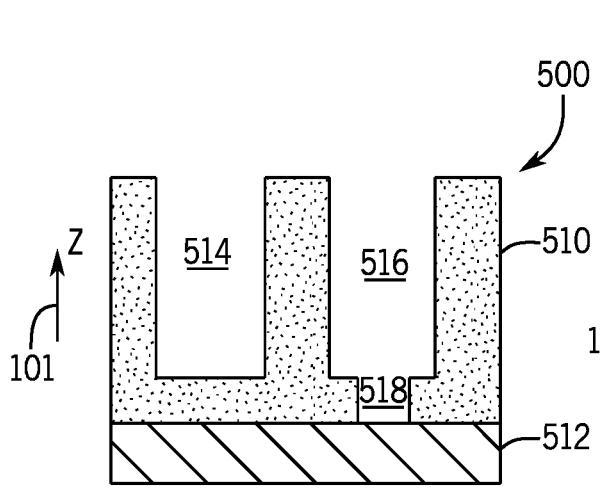
Figure 5C:
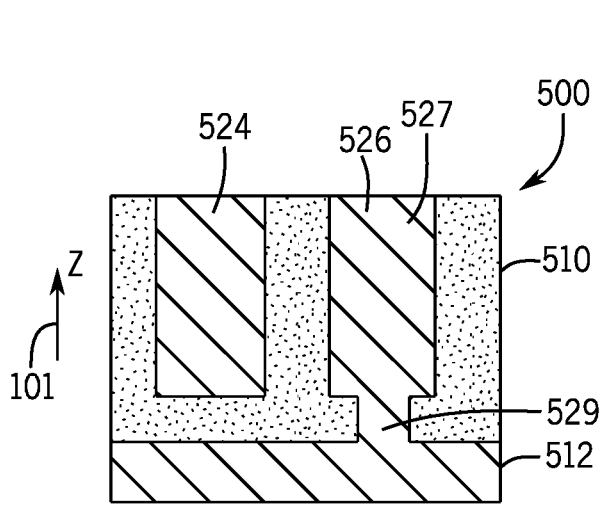
Figure 5D:
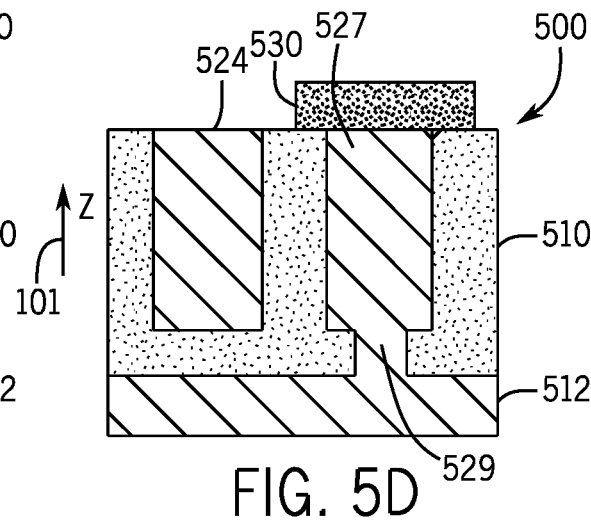
Figure 5E:
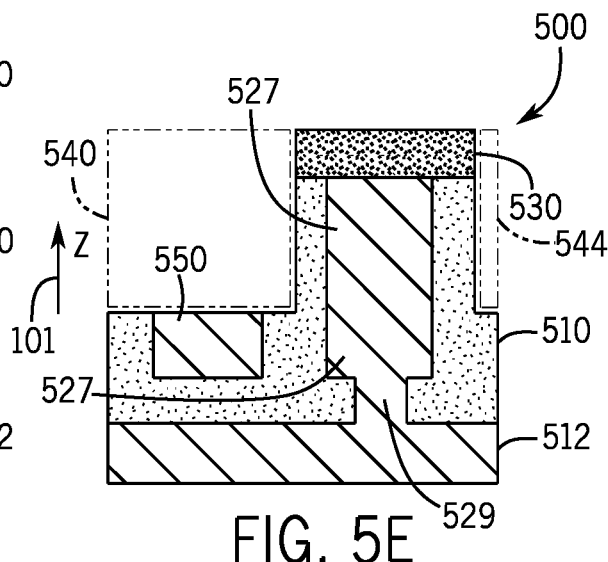
Figure 5F:
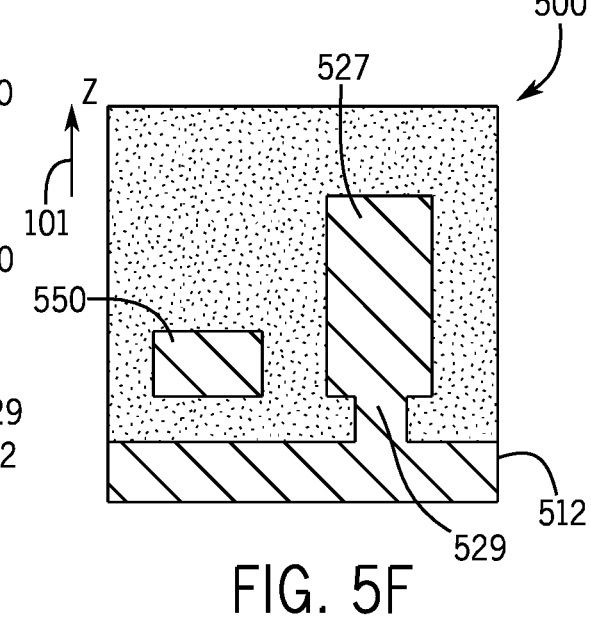
Figure 6:
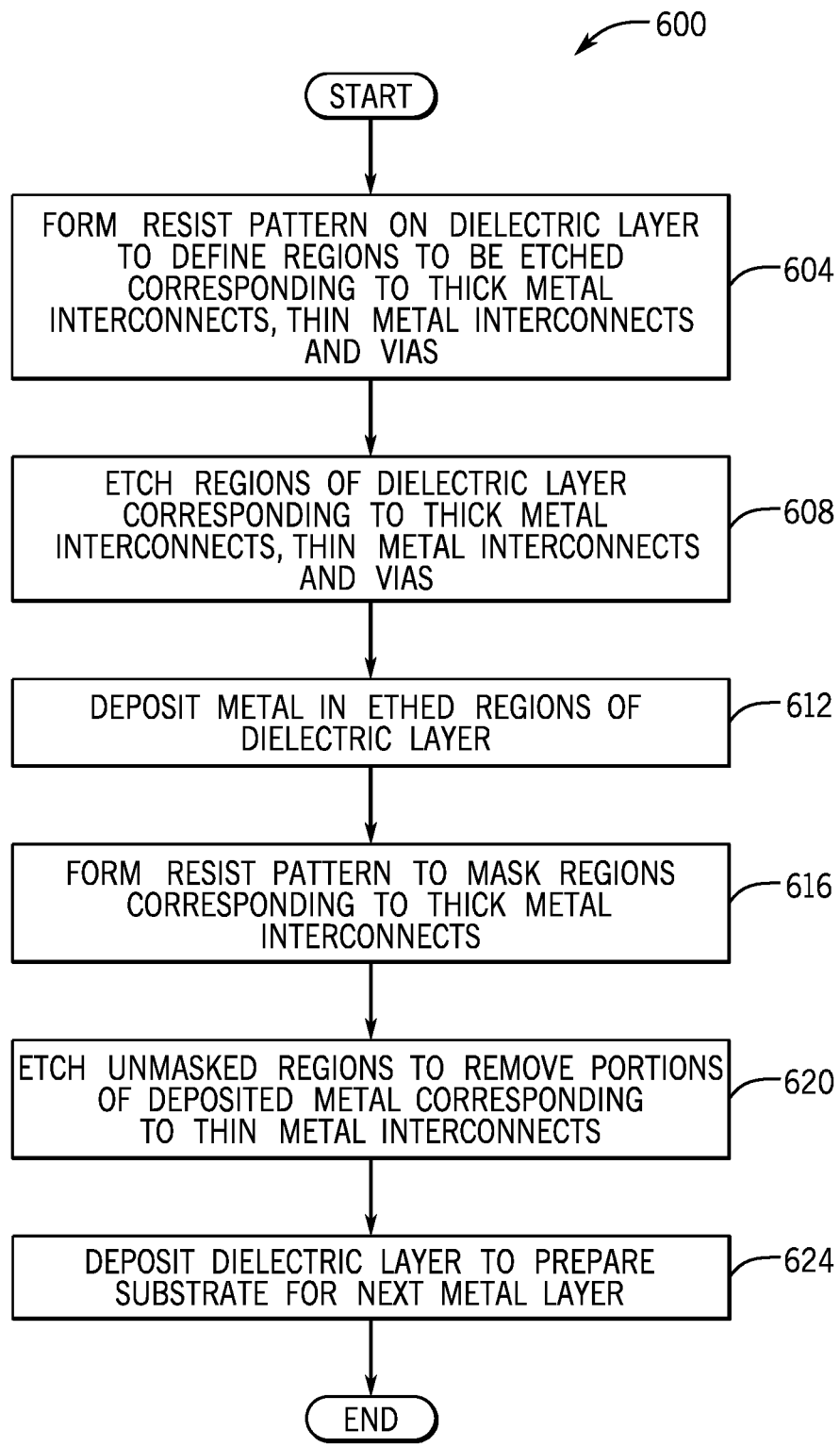

More specifically, referring to FIG. 6 in conjunction with FIGS. 5A to 5F, a technique 600 includes forming (block 604) a resist pattern (not shown) on the dielectric layer 510 (see FIG. 5A) to define regions to be etched corresponding to thick metal interconnects, thin metal interconnects, and vias. Pursuant to block 608 of the technique 600, the patterns on which the resist pattern were formed are used to etch regions of the dielectric layer 510 corresponding to the thick metal interconnects, the thin metal interconnects and the vias. As an example, FIG. 5B depicts etching of the dielectric layer 510 to form troughs, or recesses 514, 516 and 518, which correspond to recesses used to form a thin metal interconnect, a thick metal interconnect, and a via, respectively.

Referring to FIG. 6 in conjunction with FIG. 5C, the technique 600 includes depositing (block 612) metal in the etched regions of the dielectric layer 510 to form the corresponding metal lines 524 and 526, as well as deposit metal in the recess 518 to form a via 529. As examples, the metal deposited to form the via 529 may be copper, aluminum, tungsten, nickel, platinum, gold, silver or palladium. As discussed above, the first metal line 526 corresponds to the thick metal interconnect 527. Pursuant to block 616 of the technique 600, the photoresist pattern 530 has been formed to mask regions corresponding to the thick metal interconnects, as depicted in FIG. 5D.

Next, referring to FIG. 6 in conjunction with FIG. 5E, the unmasked regions are etched (block 620) to remove portions (such as illustrated portions 540 and 544 of FIG. 5E) of the substrate 500. These portions include deposited metal for purposes of forming the thin metal interconnect. In this manner, as shown in FIG. 5E, removal of the metal line 524 (see also FIG. 5D) produces the relatively thin metal interconnect 550. Lastly, pursuant to the technique 600, a dielectric layer is deposited to prepare the substrate 510 for the next metal layer. In this manner, as depicted in FIG. 5F, a dielectric layer is deposited in the portions (such as portions as 540 and 544 of FIG. 5E, for example) that were etched.

Figure 7:
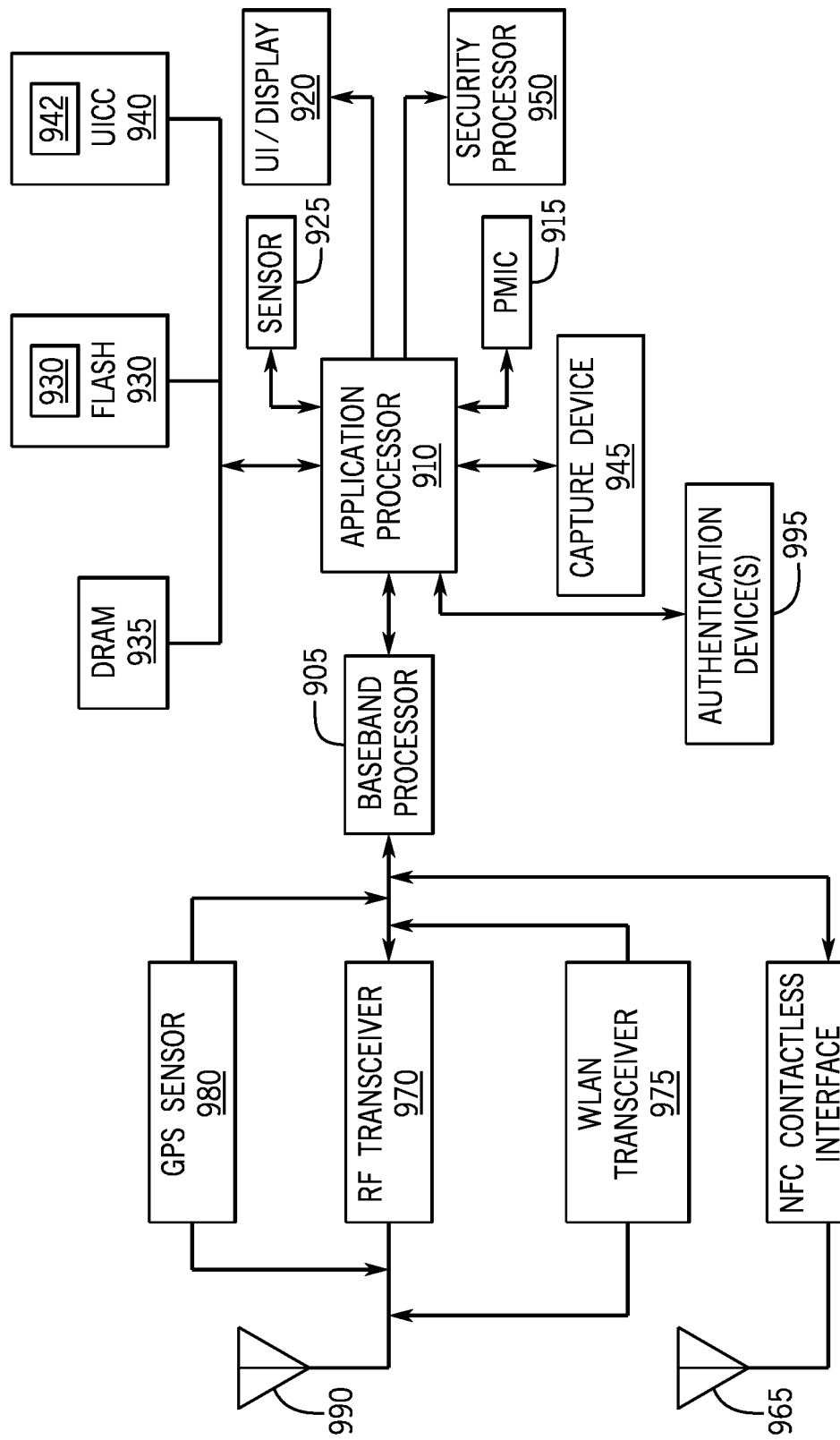
FIGS. 7 and 8 are schematic diagrams of systems according to example implementations.

Referring now to FIG. 7, in accordance with example implementations, a system 900 may include integrated circuits, which contain metal interconnects having different thicknesses, as described herein. The system 900, may be, as examples, a smartphone, a wireless communicator, or any other IoT device. A baseband processor 905 is configured to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some implementations, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 includes a subscriber identity module, which in some implementations includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 8:
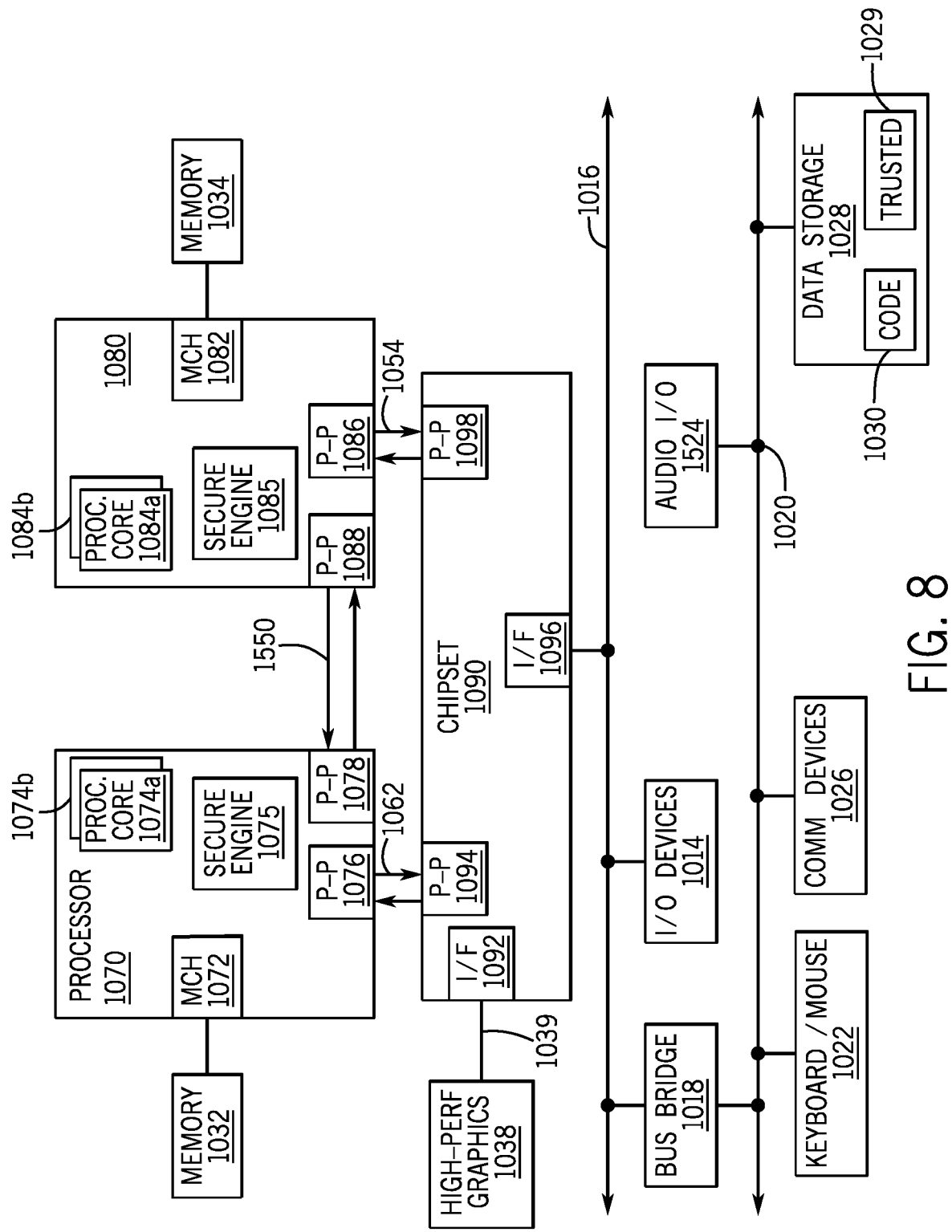

Referring to FIG. 8, in accordance with further example implementations, a multiprocessor system 1000, such as a point-to-point interconnect system (a server system, for example), may include integrated circuits having dual thickness metal interconnects, as described herein. The system 1000 may include a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

In accordance with example implementations, one or multiple integrated circuits or semiconductor devices may include interconnects that are disclosed herein, such as, for example, interconnects in integrated circuits containing the processor 910, the processor 1070, the memory 935, the memory 932, the memory 1032, the memory 1034 or the memory 1028, as just a few examples.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one implementation. As further seen, data storage unit 1028 also includes a trusted storage 1029 to store sensitive information to be protected. Further, an audio I/O 1024 may be coupled to second bus 1020.

Other implementations are contemplated and are within the scope of the appended claims. For example, in some implementations, a communication device may be arranged to perform the various and techniques described herein. In accordance with further example implementations, a device other than a communication device may be arranged to perform the various methods and techniques described herein.

Implementations may be used in many different types of systems. For example, in one implementation a communication device can be arranged to perform the various methods and techniques described herein. Of course, the scope of the present invention is not limited to a communication device, and instead other implementations can be directed to other types of apparatus for processing instructions, or one or more machine readable media including instructions that in response to being executed on a computing device, cause the device to carry out one or more of the methods and techniques described herein.

In accordance with example implementations, the techniques of FIGS. 4 and 6 may be implemented by executing machine executable instructions, or "program code," which is stored on non-transitory media. In this manner, the program code, when executed by one or multiple central processing unit(s), (one or multiple processing cores, and so forth) may cause the processor to fabricate at least one integrated circuit to perform one or multiple operations. Implementations (e.g., code for implementing the processes of FIGS. 4 and 6) may be implemented in code and may be stored on a non-transitory storage medium having stored thereon instructions which can be used to program a system to perform the instructions. Implementations also may be implemented in data and may be stored on a non-transitory storage medium, which if used by at least one machine, causes the at least one machine to fabricate at least one integrated circuit to perform one or more operations. As examples, the storage media may include semiconductor storage devices, magnetic storage devices, optical storage devices, and so forth. As more specific examples, the storage media may include floppy disks, optical disks, solid state drives (SSDs), compact disk read-only memories (CD-ROMs), compact disk rewritable (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further implementations.

Example 1 includes an apparatus that includes a first metal layer having a first thickness and a second thickness less than the first thickness, where the first metal layer includes a first interconnect having the first thickness; a second metal layer; a dielectric material extending between the first and second metal layers and directly contacting the first and second metal layers, the dielectric material that includes a via extending through the dielectric material; and a metal material of the via to directly contact the first interconnect and the second metal layer.

In Example 2, the subject matter of Example 1 can optionally include the first metal layer including a second interconnect that is parallel to the first interconnect; and the second interconnect having the first thickness.

In Example 3, the subject matter of Examples 1-2 can optionally include the first metal layer including a third interconnect and a fourth interconnect parallel to the fourth interconnect; the second interconnect being spaced apart from the first interconnect by a first distance; and the fourth interconnect being spaced apart from the third interconnect by a second distance less than the first distance.

In Example 4, the subject matter of Examples 1-3 can optionally include the first distance being substantially the sum of the first thickness and the second distance being less than a cross-sectional width of the first interconnect.

In Example 5, the subject matter of Examples 1-4 can optionally include the third interconnect having a cross-sectional width; the first interconnect having a cross-sectional width that is greater than the cross-sectional width of the third interconnect; and the first distance being substantially the sum of the first thickness and the second thickness less a cross-sectional width of the first interconnect.

In Example 6, the subject matter of Examples 1-5 can optionally include the third interconnect having a cross-sectional width; the first interconnect having a cross-sectional width that is substantially the same as the cross-sectional width of the third interconnect; and the first distance being substantially the sum of the first thickness and the second thickness less a cross-sectional width of the first interconnect.

In Example 7, the subject matter of Examples 1-6 can optionally include the first interconnect having a substantially uniform cross-sectional width.

In Example 8, the subject matter of Examples 1-7 can optionally include the cross-sectional width of the first interconnect being less than the first thickness.

In Example 9, the subject matter of Examples 1-8 can optionally include the first metal layer further including another interconnect parallel to the first interconnect; and the another interconnect having the second thickness and a cross-sectional width that is substantially the same as a cross-sectional width of the first interconnect.

In Example 10, the subject matter of Examples 1-9 can optionally include the first metal layer further including another interconnect parallel to the first interconnect; and the another interconnect having the second thickness and a cross-sectional width that is smaller than a cross-sectional width of the first interconnect.

In Example 11, the subject matter of Examples 1-10 can optionally include a system-on-chip (SoC) that includes the first metal layer, the second metal layer, the dielectric material and the metal material.

Example 12 includes a system including a memory; and a processor coupled to the memory. At least one of the processor and the memory includes an apparatus according to any one of Examples 1 to 11.

Example 13 includes a method that includes forming a first metal line and a second metal line parallel to the first metal line on a substrate, where the first metal line includes a first metal interconnect; forming a mask over the first metal interconnect; removing a portion of the second metal line to form a second interconnect from a remaining portion of the second metal line, where a thickness of the first interconnect is greater than a thickness of the second interconnect; and forming an dielectric layer on the first and second interconnects.

In Example 14, the subject matter of Example 13 can optionally include forming the first metal line and the second metal line on the substrate including masking the dielectric layer for the first and second metal lines; removing a first portion of the dielectric layer to form a first trench corresponding to the first metal line; and removing a second portion of the dielectric layer to form a second trench corresponding to the second metal line.

In Example 15, the subject matter of Examples 13-14 can optionally include forming the first metal line and the second metal line further including depositing a metal in the first and second trenches.

In Example 16, the subject matter of Examples 13-15 can optionally include making the dielectric layer for a via extending to the first metal line; and removing a third portion of the dielectric layer corresponding to the via.

In Example 17, the subject matter of Examples 13-16 can optionally include depositing a metal in the first trench and in the via to form the first metal line and a direct connection between the first metal line and a metal layer on the substrate other than a metal layer containing the first metal line.

In Example 18, the subject matter of Examples 13-17 can optionally include forming the first metal line and the second metal line including depositing metal associated with a single metal layer.

Example 19 includes an apparatus that includes a first metal layer having a first thickness and a second thickness less than the first thickness, where the first metal layer includes a first plurality of parallel interconnects and each interconnect of the first plurality of interconnects has a first thickness; and a second plurality of parallel interconnects, where each interconnect of the second plurality of interconnects has a second thickness less than the first thickness; a second metal layer; a dielectric material extending between the first and second metal layers and directly contacting the first and second metal layers, where the dielectric material that includes a via extending through the dielectric material; and a metal material of the via to directly contact the second metal layer and at least one of the interconnects of the first plurality of parallel interconnects.

In Example 20, the subject matter of Example 19 may optionally include the first plurality of interconnects having an associated first spacing between adjacent interconnects of the first plurality of parallel interconnects; the second plurality of interconnects having an associated second spacing between adjacent interconnects of the second plurality of parallel interconnects; and the second spacing being less than the first spacing.

In Example 21, the subject matter of Examples 19-20 can optionally include the first plurality of interconnects being parallel to a first axis and the thickness of each interconnect of the first plurality of interconnects corresponding to a dimension measured along a second axis orthogonal to the first axis.

The foregoing description of the implementations of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The implementations of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method comprising:
   forming a first metal line and a second metal line parallel to the first metal line on a substrate, wherein the first metal line comprises a first metal interconnect;
   forming a mask over the first metal interconnect;
   removing a portion of the second metal line to form a second interconnect from a remaining portion of the second metal line, wherein a thickness of the first interconnect along a depth dimension is greater than a thickness of the second interconnect along the depth dimension; and
   forming a dielectric layer on the first and second interconnects.

2. The method of claim 1, wherein forming the first metal line and the second metal line comprises:
   masking the dielectric layer for the first and second metal lines;
   removing a first portion of the dielectric layer to form a first trench corresponding to the first metal line; and
   removing a second portion of the dielectric layer to form a second trench corresponding to the second metal line.

3. The method of claim 2, wherein forming the first metal line and the second metal line further comprises depositing a metal in the first and second trenches.

4. The method of claim 1, further comprising:
   masking the dielectric layer for a via extending to the first metal line; and
   removing a third portion of the dielectric layer corresponding to the via.

5. The method of claim 4, further comprising:
   depositing a metal in the first trench and in the via to form the first metal line and a direct connection between the first metal line and a metal layer on the substrate other than a metal layer containing the first metal line.

6. The method of claim 1, wherein forming the first metal line and the second metal line comprises depositing metal associated with a single metal layer.

* * * * *